US011043960B2

(12) United States Patent
Bal et al.

(10) Patent No.: US 11,043,960 B2
(45) Date of Patent: Jun. 22, 2021

(54) SIGMA-DELTA ANALOG-TO-DIGITAL CONVERTER CIRCUIT WITH CORRECTION FOR MISMATCH ERROR INTRODUCED BY THE FEEDBACK DIGITAL-TO-ANALOG CONVERTER

(71) Applicant: STMicroelectronics International N.V., Geneva (CH)

(72) Inventors: Ankur Bal, Greater Noida (IN); Rupesh Singh, Ghaziabad (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/895,183

(22) Filed: Jun. 8, 2020

(65) Prior Publication Data
US 2020/0389180 A1    Dec. 10, 2020

Related U.S. Application Data

(60) Provisional application No. 62/859,531, filed on Jun. 10, 2019.

(51) Int. Cl.
*H03M 3/00* (2006.01)
*H03M 1/06* (2006.01)
*H03M 1/10* (2006.01)

(52) U.S. Cl.
CPC ......... *H03M 3/464* (2013.01); *H03M 1/0626* (2013.01); *H03M 1/1019* (2013.01);
(Continued)

(58) Field of Classification Search
CPC ...... H03M 3/464; H03M 3/424; H03M 3/388; H03M 1/1019; H03M 3/462; H03M 3/436;
(Continued)

(56) References Cited

U.S. PATENT DOCUMENTS 5,825,253 A * 10/1998 Mathe ............... H03L 7/183
331/18
6,356,129 B1 * 3/2002 O'Brien ............. H03K 5/00006
327/156

(Continued)

FOREIGN PATENT DOCUMENTS

EP    3182595 A1    6/2017

OTHER PUBLICATIONS

EPO Search Report and Written Opinion for co-pending EP Appl. No. 20179084.7 dated Oct. 22, 2020 (16 pages).

(Continued)

*Primary Examiner* — Jean B Jeanglaude
(74) *Attorney, Agent, or Firm* — Crowe & Dunlevy

(57) ABSTRACT

A sigma-delta modulator includes an N-bit quantization circuit that generates a stream of N-bit code words and a feedback signal path with an N-bit DAC circuit, having a non-ideal operation due to mismatch error, that converts the stream of N-bit code words to generate a feedback signal. A digital DAC copy circuit provides a digital replication of the N-bit DAC circuit. The digital replication accounts for the non-ideal operation of the N-bit DAC circuit 126 due to mismatch error, and converts the stream of N-bit code words to generate a stream of P-bit code words, where P>N, that are functionally equivalent to the feedback signal output from the N-bit DAC circuit.

28 Claims, 3 Drawing Sheets

(52) U.S. Cl.
CPC ........... *H03M 3/344* (2013.01); *H03M 3/388* (2013.01); *H03M 3/424* (2013.01); *H03M 3/436* (2013.01); *H03M 3/462* (2013.01); *H03M 3/466* (2013.01); *H03M 3/504* (2013.01)

(58) Field of Classification Search
CPC .... H03M 3/466; H03M 3/344; H03M 1/0626; H03M 3/504; H03M 5/50; H03M 3/30
USPC .......................................... 341/143, 144, 155
See application file for complete search history.

(56) References Cited

U.S. PATENT DOCUMENTS

| | | | | |
|---|---|---|---|---|
| 6,606,004 | B2 * | 8/2003 | Staszewski | H03L 7/093 |
| | | | | 331/17 |
| 7,030,792 | B2 * | 4/2006 | Chen | H03M 1/0663 |
| | | | | 341/118 |
| 7,053,808 | B2 * | 5/2006 | Chen | H03M 1/0663 |
| | | | | 341/118 |
| 7,271,666 | B1 * | 9/2007 | Melanson | H03L 7/1976 |
| | | | | 331/16 |
| 7,362,247 | B2 | 4/2008 | Arias et al. | |
| 7,522,690 | B2 * | 4/2009 | Zhang | H03L 7/087 |
| | | | | 375/147 |
| 7,994,957 | B2 * | 8/2011 | O'Donnell | H03M 1/0836 |
| | | | | 341/144 |
| 8,542,138 | B2 * | 9/2013 | Galton | H03M 3/388 |
| | | | | 341/118 |
| 9,203,426 | B2 | 12/2015 | Zhao et al. | |
| 9,438,266 | B1 | 9/2016 | Nagaraj et al. | |
| 9,735,797 | B2 | 8/2017 | Zhao et al. | |
| 10,148,278 | B2 | 12/2018 | Bresciani et al. | |
| 2006/0056561 | A1 * | 3/2006 | Zhang | H03L 7/1976 |
| | | | | 375/376 |
| 2008/0025383 | A1 * | 1/2008 | Li | G01R 31/31922 |
| | | | | 375/226 |
| 2011/0037631 | A1 | 2/2011 | Lai et al. | |
| 2012/0194369 | A1 * | 8/2012 | Galton | H03M 3/388 |
| | | | | 341/120 |
| 2014/0070969 | A1 | 3/2014 | Shu | |
| 2019/0173479 | A1 * | 6/2019 | Dyachenko | H03M 1/0641 |

OTHER PUBLICATIONS

Petrie C et al: "A Background Calibration Technique for Multibit Delta-Sigma Modulators" Circuits and Systems 2000 Proceedings ISCAS 2000 Geneva, The 2000 IEEE International Symposium on May 28-31, 2000 Piscataway NY USA, vol. 2 May 28, 2000 pp. 29-32.

* cited by examiner

SIGMA-DELTA ANALOG-TO-DIGITAL CONVERTER CIRCUIT WITH CORRECTION FOR MISMATCH ERROR INTRODUCED BY THE FEEDBACK DIGITAL-TO-ANALOG CONVERTER

CROSS REFERENCE TO RELATED APPLICATION

This application claims priority from U.S. Provisional Application Patent No. 62/859,531 filed Jun. 10, 2019, the disclosure of which is incorporated by reference.

TECHNICAL FIELD

Embodiments generally relate to an analog-to-digital converter circuit and, in particular, to a sigma-delta analog-to-digital converter circuit.

BACKGROUND

FIG. 1 shows a time domain block diagram of a conventional sigma-delta analog-to-digital converter circuit 10. The circuit 10 includes a first order sigma-delta modulator circuit 12 having an input configured to receive an analog input signal A and an output configured to generate a digital output signal B comprised of a pulse density modulated pulse stream of 1-bit codes. The ratio formed by a count of the number of pulses in the pulse stream of the signal B divided by a total number of samples (set by a sampling rate fs) of the input signal A over a known time interval represents the instantaneous magnitude of the input signal A. The circuit 10 further includes a decimator circuit 14 that accumulates and averages the pulses in the pulse stream of the digital output signal B to generate a digital signal C comprised of a stream of multi-bit (M-bit, where M>>1) digital words at a data rate set by a decimation rate fd, where fd<<fs (referred to in the art as oversampling).

The first order sigma-delta modulator circuit 12 comprises a difference amplifier 20 (or summation circuit) having a first (non-inverting) input that receives the analog input signal A and a second (inverting) input that receives an analog feedback signal D. The difference amplifier 20 outputs an analog difference signal vdif in response to a difference between the analog input signal A and the analog feedback signal D (i.e., vdif(t)=A(t)−D(t)). The analog difference signal vdif is integrated by an integrator circuit 22 to generate a change signal vc having a slope and magnitude that is dependent on the sign and magnitude of the analog difference signal vdif. A voltage comparator circuit 24 samples the change signal vc at the sampling rate fs and compares each sample of the change signal vc to a reference signal vref to generate a corresponding the single bit pulse of the digital output signal B (where the single bit has a first logic state if vc≥vref and has a second logic state if vc<vref). The voltage comparator circuit 24 effectively operates as a single bit quantization circuit. A single bit digital-to-analog converter (DAC) circuit 26 then converts the logic state of the digital output signal B to a corresponding analog voltage level for the analog feedback signal D.

It is possible to instead implement the sigma-delta modulator circuit 12 with a multi-bit quantization (for example, N bits, where 1<N<<M) as shown by FIG. 2. This circuit implementation requires an N-bit quantization circuit 24' and an N-bit DAC circuit 26' in the feedback loop. The quantization circuit 24' samples the change signal vc at the sampling rate fs and generates for each sample a corresponding N-bit code word for the digital output signal B. The DAC circuit 26' converts the N-bit code word of the digital output signal B to a corresponding analog voltage level for the analog feedback signal D. The decimator circuit 14 accumulates and averages the N-bit code words in the stream of the digital output signal B to generate a digital signal C comprised of the stream of multi-bit (M-bit, where M>>N) digital words at a data rate set by a decimation rate fd. In an example, N=3-5 and M=12-16. The use of multi-bit quantization presents a number of advantages including: permitting operation of the modulator to achieve a given resolution using a lower sampling rate fs; or permitting operation of the modulator to achieve a higher resolution for a given sampling rate fs.

A key characteristic of the sigma-delta modulator circuit 12 is its ability to push the quantization noise due to operation of the quantization circuit 24, 24' to higher frequencies away from the signal of interest. This is known in the art as noise shaping. The decimator circuit 14 can then be implemented with a low-pass filtering characteristic to substantially remove the high frequency components of the shaped quantization noise.

The use of multi-bit quantization in sigma-delta modulator circuits, however, is difficult because the inherent non-linearity present in the operation of the DAC circuit 26' in the feedback loop translates directly into non-linearity of the entire modulator 12. This non-linearity is due, for example, to the existence of unequal analog output steps (i.e., mismatch error) for the multi-bit DAC circuit.

The output of an ideal DAC is the sum of the outputs of its actuated unit elements:

$$a_{ideal}(k) = \Delta \Sigma_{i=1}^{U} b_i(k) \tag{Eq 1}$$

where: $b_i(k)$ for (i=1, 2, ... U) is referred to as the selecting signals (unary thermometric in this embodiment) depending on DAC precision. In case of an N=4 bit DAC, there are $U=(2^4-1)=15$ unit elements, and k in $b_i(k)$ is the kth input; and where $\Delta$ equals the quantization step. As an example, for $\Delta=0.1V$ and $b_i(k)=<111100000000000>$, the ideal DAC will output an analog voltage of 0.4 V (i.e., the summation of four selected unit elements of 0.1 V each).

In practice, the current sources used in the DAC are not ideal in nature resulting in deviations from their ideal value. Assume $e_i$ (i=1, 2, ... , U) are the values of normalized deviations of the unit elements outputs from their mean value (referred to as unit element errors). Thus, the output of each unit element can be represented as $\Delta (1+e_i)$. The output of a non-ideal DAC is then:

$$a_{actual}(k) = \Delta \Sigma_{i=1}^{U} b_i(k) + \Delta \Sigma_{i=1}^{U} b_i(k) e_i \tag{Eq 2}$$

On comparing the Equation 2 with the ideal DAC output Equation 1, the second term in Equation 2 is the error introduced in the DAC and is referred as DAC error (or mismatch error). Using the same example with $\Delta=0.1V$ and $b_i(k)=<111100000000000>$, when the first four DAC elements are summed, their errors are also summed and presented at the output to produce an analog voltage of 0.1* $((1+e_1)+(1+e_2)+(1+e_3)+(1+e_4))$.

The DAC error is basically then the sum of the selecting signals (i.e., $b_i(k)$) multiplied by corresponding errors ($e_i$) over U signals:

$$DAC\ error = \Delta \Sigma_{i=1}^{U} b_i(k) e_i \tag{Eq 3}$$

As a result of the non-linearity introduced in the analog output of the DAC by the DAC error, a distorted modulator output is produced. The non-linearity also modulates the quantization noise of the quantization circuit 24' into the signal band resulting in a degraded signal-to-noise ratio (SNR).

In order to take advantage of the benefits of multi-bit quantization in sigma-delta modulator circuits, it is necessary to estimate the inherent non-linearity present in the operation of the multi-bit DAC circuit and apply a correction to nullify its effects.

SUMMARY

In an embodiment, a sigma-delta modulator comprises: a differencing circuit having a first input configured to receive an input signal and a second input configured to receive a feedback signal and an output configured to generate a difference signal; a K-th order loop filter circuit configured to filter the difference signal and generate a change signal; an N-bit quantization circuit configured to sample the change signal at a sampling frequency rate, quantize the sampled change signal and generate a stream of N-bit code words; an N-bit digital-to-analog converter (DAC) circuit configured to convert the stream of N-bit code words to generate the feedback signal, wherein the N-bit DAC circuit has a non-ideal operation due to mismatch error; and a digital DAC copy circuit that provides a digital replication of the N-bit DAC circuit, said digital replication accounting for the non-ideal operation of the N-bit DAC circuit due to mismatch error, the digital DAC copy circuit configured to convert the stream of N-bit code words to output a stream of P-bit code words, where P>N, that are functionally equivalent to the feedback signal output from the N-bit DAC circuit.

In an embodiment, a sigma-delta modulator comprises: a differencing circuit having a first input configured to receive an input signal and a second input configured to receive a feedback signal and an output configured to generate a difference signal; a K-th order loop filter circuit configured to filter the difference signal and generate a change signal; an N-bit quantization circuit configured to sample the change signal at a sampling frequency rate, quantize the sampled change signal and generate a stream of N-bit code words; an N-bit digital-to-analog converter (DAC) circuit configured to convert the stream of N-bit code words to generate the feedback signal, wherein the N-bit DAC circuit has a non-ideal operation due to mismatch error; and a digital DAC copy circuit that provides a digital replication of the N-bit DAC circuit, said digital replication accounting for the non-ideal operation of the N-bit DAC circuit due to mismatch error, the digital DAC copy circuit configured to convert the stream of N-bit code words to output a stream of P-bit code words, where P>N, each P-bit code word comprising a combination of: a first digital code corresponding to an ideal output of the N-bit DAC circuit in response to the N-bit code word; a second digital code corresponding to unit element error of the N-bit DAC circuit in response to the N-bit code word.

BRIEF DESCRIPTION OF THE DRAWINGS

For a better understanding of the embodiments, reference will now be made by way of example only to the accompanying figures in which.

DETAILED DESCRIPTION

Figure 3:
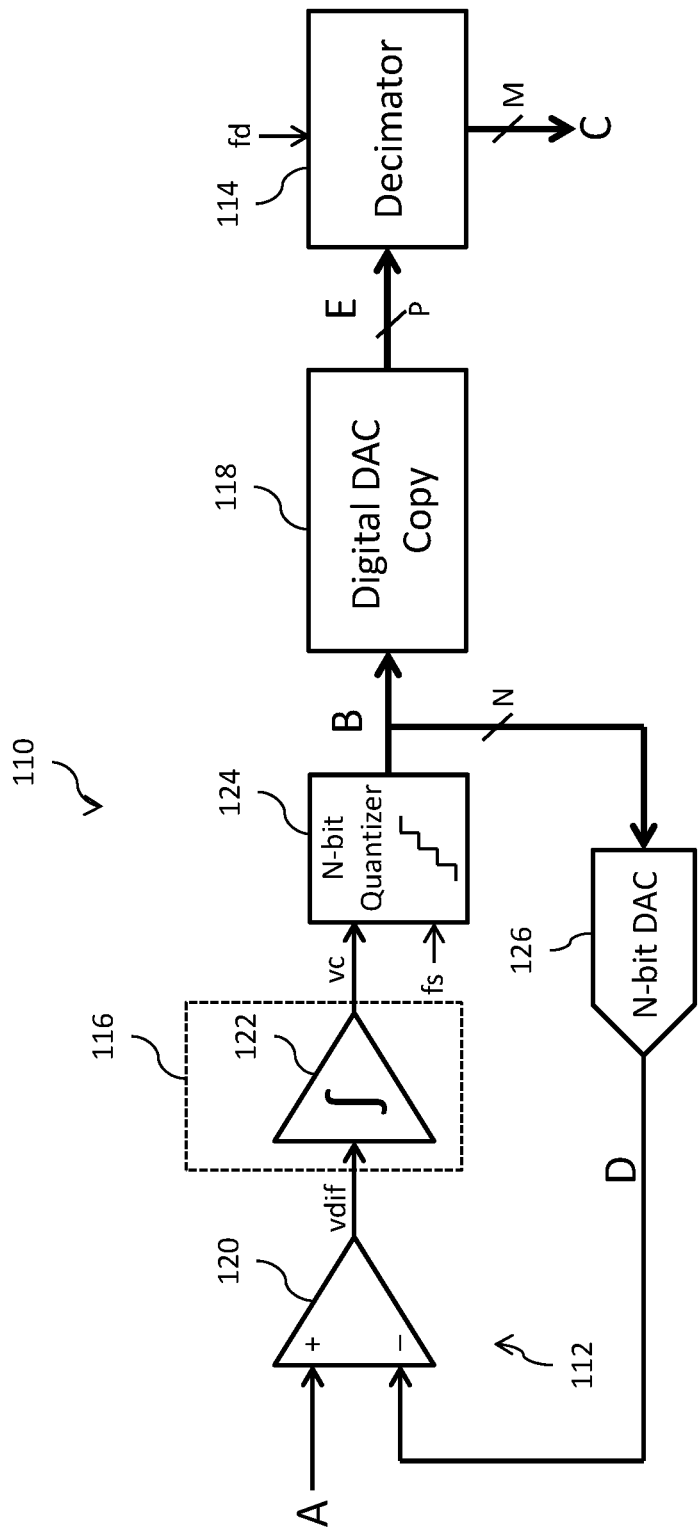
FIG. 3 is a block diagram of a sigma-delta analog-to-digital converter circuit with multi-bit quantization and feedback digital-to-analog converter mismatch correction.

Reference is now made to FIG. 3 which shows a block diagram of a sigma-delta analog-to-digital converter circuit 110 with multi-bit quantization and feedback digital-to-analog converter (DAC) mismatch correction. The circuit 110 includes an N-bit sigma-delta modulator circuit 112 having an input configured to receive an analog input signal A and an output configured to generate a digital output signal B comprised of a stream of N-bit code words. The sigma-delta modulator circuit 112 comprises a difference amplifier 120 (i.e., summation circuit) having a first (non-inverting) input that receives the analog input signal A and a second (inverting) input that receives an analog feedback signal D. The difference amplifier 20 outputs an analog difference signal vdif in response to a difference between the analog input signal A and the analog feedback signal D (where vdif(t)=A(t)−D(t)). The analog difference signal vdif is integrated by a K-order loop filter 116 (using, for example, K integrator circuits 122) to generate a change signal vc having a slope and magnitude that is dependent on the sign and magnitude of the analog difference signal vdif. An N-bit quantization circuit 124 samples the change signal vc at the sampling rate fs and generates for each sample a corresponding N-bit code word of the digital output signal B. An N-bit digital-to-analog converter (DAC) circuit 126 in the feedback loop converts the N-bit code word of the digital output signal B to a corresponding voltage level for the analog feedback signal D.

Figure 1:
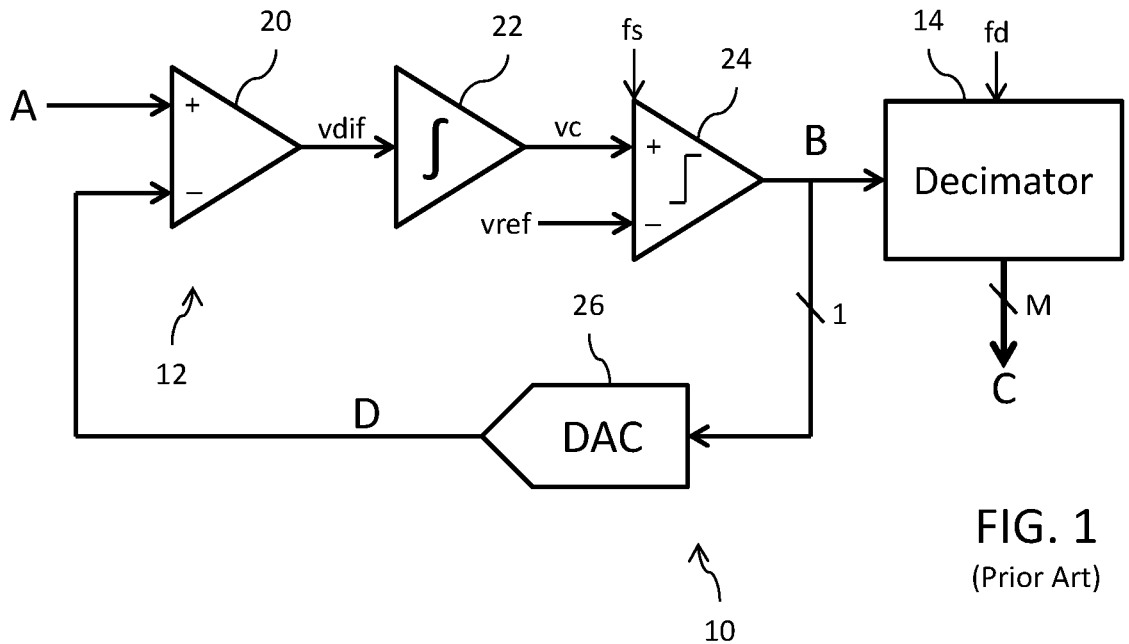
FIG. 1 is a block diagram of a conventional sigma-delta analog-to-digital converter circuit with single bit quantization.
Figure 2:
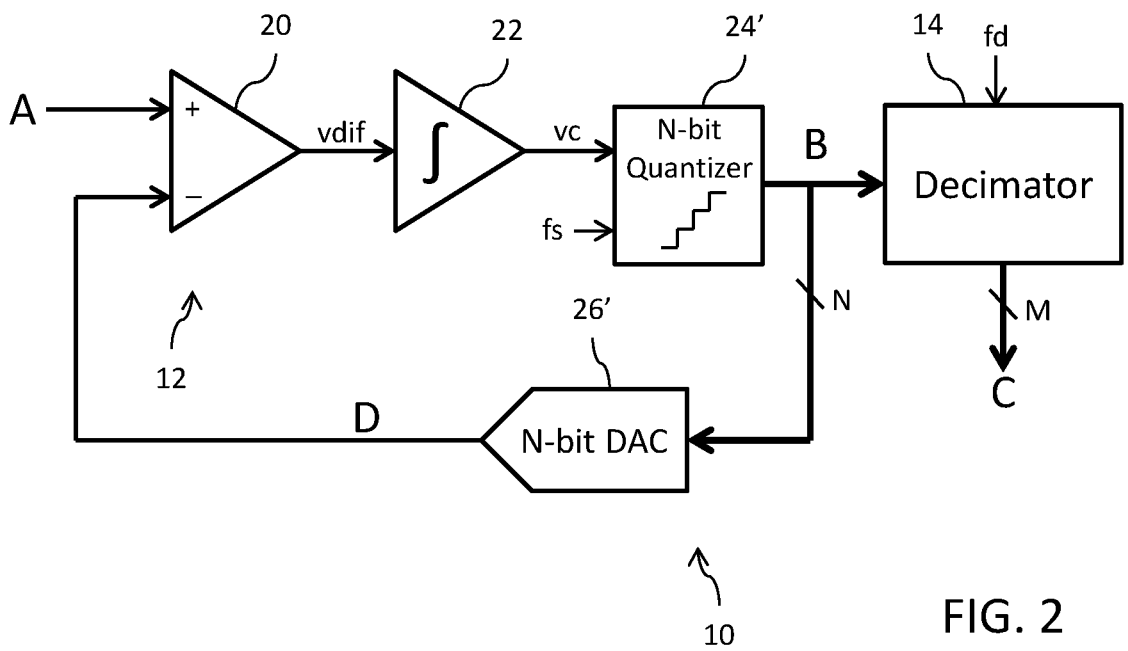
FIG. 2 is a block diagram of a conventional sigma-delta analog-to-digital converter circuit with multi-bit quantization.

The sigma-delta modulator circuit 112 implements a loop filter 116 with a K-order integration circuit implementation. In the illustration of FIG. 1, K=1 as there is only one integration shown (with integrator 122) in the loop filter 116, but it will be understood that this is by way of example only, and K may equal 2, 3 or more as needed by the desired noise shaping and circuit application. Those skilled in the know how to implement a K>1 order loop filter 116 for the sigma-delta modulator circuit 112.

It is known in the prior art to address the issue of the feedback DAC mismatch error by applying correction at the DAC circuit itself. See, for example, U.S. Pat. No. 10,148,278 (incorporated by reference). It is also known in the prior art to address the issue of the feedback DAC mismatch error by applying correction at the decimator circuit. See, for example, U.S. Pat. No. 9,438,266 (incorporated by reference). The sigma-delta analog-to-digital converter circuit 110 of FIG. 3 uses a different solution to the issue of compensating for feedback DAC mismatch error.

The stream of N-bit code words for the digital output signal B produced by the N-bit quantization circuit 124 are input to the N-bit DAC circuit 126 in the feedback path and are further input to a digital DAC copy circuit 118. In this context, the digital DAC copy circuit 118 is calibrated (in a manner to be discussed in detail herein) to digitally model the operation of the feedback N-bit DAC circuit 126. In other words, to digitally model the ideal DAC operation plus the DAC error introduced by the non-linear operation of the unit elements:

$$\text{DAC error} = \Delta \Sigma_{i=1}^{U} b_i(k) e_i$$

As previously noted, the digital output signal B from the N-bit quantization circuit 124 is subjected to quantization error along with the desired signal. Those skilled in the art understand that any signal or noise entity injected at any point in the feedback loop of the modulator 112 will be high passed (i.e., noise shaped) by the noise transfer function of the modulator. The effect of this high pass noise shaping of the injected signal or noise is visible just after the point of injection. So, the quantization error injected into the feedback loop by the N-bit quantization circuit 124 is advantageously noise shaped (high passed) by the modulator 112 at the digital output signal B with a high pass function $(1-z^{-1})^K$ proportional to the order (K) of the modulator.

On further traversing the feedback loop, the digital output signal B is processed by the N-bit DAC circuit 126 of the modulator 112. This N-bit DAC circuit 126 has a non-ideal operation due at least in part to a mismatch between its building blocks (unit elements, as discussed above) as a result of circuit fabrication imperfections. A DAC having a non-ideal operation can be modelled as an ideal DAC followed by an error signal source injecting the mismatch error (see, also, Equation 2). As with the case of the N-bit quantization circuit 124 discussed above, with the N-bit DAC circuit 126 inserted in the feedback loop of the modulator 112, the mismatch error due to operation of the N-bit DAC circuit 126 is high passed (i.e., noise shaped) by the noise transfer function of the modulator. The effect of this high pass noise shaping of the injected mismatch error is visible just after the point of injection. So, the mismatch error injected into the feedback loop by the N-bit DAC circuit 126 is advantageously noise shaped (high passed) by the modulator 112 at the analog feedback signal D with a high pass function $(1-z^{-1})^K$ proportional to the order (K) of the modulator.

The digital DAC copy circuit 118 provides a digital replication of the analog N-bit DAC circuit 126, that replication specifically accounting for the non-ideal operation of the N-bit DAC circuit 126 due to unit element mismatch. More specifically, the digital DAC copy circuit 118 is programmed with a plurality of digital code words that are directly proportional to the value of the mismatched unit elements of the analog N-bit DAC circuit 126. In other words, digital codes corresponding to the analog value of the unit element error $e_i$. The digital code words can be of any selected precision P, and are determined using a calibration process (to be discussed in detail herein). It will be appreciated that if the digital model provided by the digital DAC copy circuit 118 is substantially identical to the non-ideal actual operation of the analog N-bit DAC circuit 126, then the digital signal E output from the digital DAC copy circuit 118 will be functionally equivalent to the analog feedback signal D output from the analog N-bit DAC circuit 126. In this context, "functionally equivalent" means that an analog conversion of the digital value for the digital signal E generated in response to signal B by the digital DAC copy circuit 118 is substantially equal to the corresponding analog value for the analog feedback signal D generated in response to that same signal B. The digital signal E output by the digital DAC copy circuit 118 comprises a stream of P-bit code words (where P>N, the higher resolution provide by P bits being necessary to provide fractional components necessary to account for effects of the mismatch error). The difference in bits (P-N) defines the degree of substantial equality that is achievable.

The operation of the digital DAC copy circuit 118 may be better understood through the use of an example. Assume that the digital output signal B has four bits (i.e., N=4) and for one specific case has a digital value of <0010> output from the N-bit quantization circuit 124 resulting in a selection signal of <1100000000000000>. If the analog N-bit DAC circuit 126 had an ideal functional operation, the analog voltage for the analog feedback signal D output from the analog N-bit DAC circuit 126 would have a value of $2*\Delta$. However, due to mismatch error, the voltage of the generated analog feedback signal D output from the analog N-bit DAC circuit 126 instead has a value of $2*\Delta+e_1\Delta+e_2\Delta$. The calibration process to be described herein digitally measures the analog voltage output from the analog N-bit DAC circuit 126 for each possible code word for the digital output signal B, and from those measurements determines the error $e_i$ for each unit element (i=1, 2, . . . U). A digital code word corresponding to each determined unit element error is then produced and programmed into the digital DAC copy circuit 118. So, with consideration to the same example where the digital output signal B from the N-bit quantization circuit 124 has a digital value of <0010>, the digital signal E output from the digital DAC copy circuit 118 will be a code word with a precision of P-bits formed by summing the N-bit digital code for $2*\Delta$ (i.e., the ideal response) plus the digital code for $\Delta$ times the sum of the programmed digital code words for the unit element errors $e_1$ and $e_2$ (i.e., $\Delta(e_1+e_2)$) which is the introduced mismatch error.

It will be noted that the calibration process can be used to generate a look-up table that is programmed into the digital DAC copy circuit 118 and used to translate the received N-bit digital values generated by the N-bit quantization circuit 124 into corresponding P-bit digital values for the digital signal E. It will be understood that translation techniques other than use of a look-up table could be implemented by the digital DAC copy circuit 118. For example, a summation node could be utilized to selectively sum the estimated mismatch codes of the model depending on the received unary inputs. This could be the preferred method if inputs other than thermometric codes (e.g., scrambled unary codes) are applied as input to the digital DAC copy circuit 118. In rare instances of design where inputs to the digital DAC copy circuit 118 are binary or two's complement, a multiply-add structure could instead be used.

The circuit 110 further includes a decimator circuit 114 that accumulates and averages the P-bit code words in the stream of the digital output signal E to generate a digital signal C comprised of a stream of multi-bit (M-bit) digital words at a data rate set by a decimation rate fd, where fd<<fs and 1<N<P<<M. The decimator circuit 114 implements a low pass filtering to effectively remove the high-passed signal components of the quantization error and mismatch error.

Let em(n) be the mismatch error introduced by the operation of the DAC circuit 126 due to the existence of unequal analog output steps, where n is the sampling index. The analog feedback signal D may accordingly be given in the Z-domain by:

$$v(n)+em(n)(1-z^{-1})^K$$

where: v(n) is the ideal output of the quantization circuit 124.

Furthermore, let eq(n) be the quantization error introduced by the operation of the n-bit quantization circuit 124. The digital output signal B may be given in the Z-domain by:

$$v(n)+eq(n)(1-z^{-1})^K$$

The digital signal E may be given by:

$$v(n)+(eq(n)+em(n))(1-z^{-1})^K$$

It will be noted that both the quantization error and the mismatch error have been high pass noise shaped.

Figure 4:
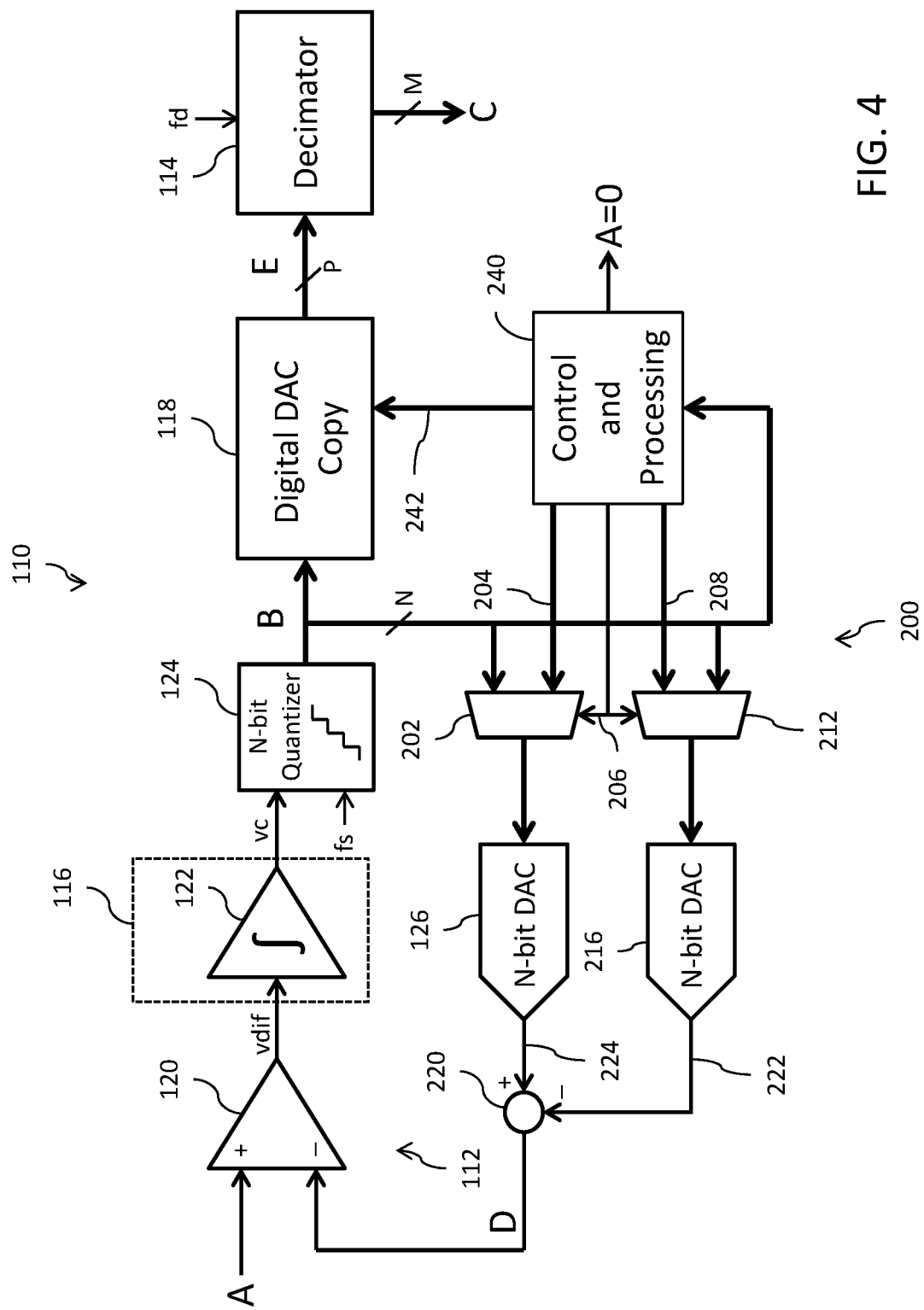
FIG. 4 is a block diagram showing configuration circuitry for the circuit of FIG. 3.

Reference is now made to FIG. 4 which additionally shows the calibration circuitry 200 for the N-bit sigma-delta modulator circuit 112 that is used to program the digital DAC copy circuit 118 with a digital model of the feedback N-bit DAC circuit 126. A first multiplexer circuit 202 has a first input coupled to receive the digital output signal B produced by the N-bit quantization circuit 124 and a second input configured to receive a digital code word calibration signal 204. The selection operation of the first multiplexer circuit 202 is controlled by a selection control signal 206 such that when the selection control signal 206 is in a first logic state the digital output signal B is passed by the first multiplexer circuit 202 to the feedback N-bit DAC circuit 126 and when the selection control signal 206 is in a second logic state the digital code word calibration signal 204 is passed by the first multiplexer circuit 202 to the feedback N-bit DAC circuit 126.

A second multiplexer circuit 212 has a first input coupled to receive a digital zero (or null) input signal 208 and a second input configured to receive the digital output signal B produced by the N-bit quantization circuit 124. The selection operation of the second multiplexer circuit 212 is also controlled by the selection control signal 206 such that when the selection control signal 206 is in the first logic state the digital zero (or null) input signal 208 is passed by the second multiplexer circuit 212 to an N-bit estimation DAC circuit 216 and when the selection control signal 206 is in a second logic state the digital output signal B is passed by the second multiplexer circuit 212 to the N-bit estimation DAC circuit 216.

The N-bit estimation DAC circuit 216 is configured to have a linear response (i.e., none to negligible mismatch error) through the use of dynamic element matching (DEM) techniques known to those skilled in the art. In this regard, those skilled in the art understand that the DEM technique works well for low frequency band limited signals, and such signals are the signals being processed during calibration mode. The DEM is not so effective for high frequency wide bandwidth signals, such as with the input signal A, and thus use of the DEM technique for the feedback N-bit DAC circuit 126 is not a particularly effective or economical solution.

A differencing (summation) circuit 220 subtracts the analog signal 222 output by the N-bit estimation DAC circuit 216 from the analog signal 224 output by the feedback N-bit DAC circuit 126 to generate the analog feedback signal D.

A control and processing circuit 240 for the calibration operation has an input coupled to receive the digital output signal B produced by the N-bit quantization circuit 124. The control and processing circuit 240 further generates the selection control signal 206, as well as the digital code word signal 204 and the digital zero (or null) input signal 208, and can further apply a selected input signal A during calibration mode. The control and processing circuit 240 operates in calibration mode to identify the mismatch error of the feedback N-bit DAC circuit 126 from the received digital output signal B and program the digital DAC copy circuit 118 through signal 242 to digitally model the operation of the feedback N-bit DAC circuit 126.

When the N-bit sigma-delta modulator circuit 112 is not being calibrated, the control and processing circuit 240 asserts the selection control signal 206 in the first logic state so that the digital output signal B is passed by the first multiplexer circuit 202 to the feedback N-bit DAC circuit 126 and the zero (or null) input signal 208 is passed by the second multiplexer circuit 212. In this mode, the circuit is configured for operation in the manner shown by FIG. 3 because the analog signal 222 output by the N-bit estimation DAC circuit 216 is zero.

When the N-bit sigma-delta modulator circuit 112 is being calibrated, the control and processing circuit 240 asserts the selection control signal 206 in the second logic state so that the digital code word calibration signal 204 is passed by the first multiplexer circuit 202 to the feedback N-bit DAC circuit 126 and the digital output signal B is passed by the second multiplexer circuit 212 to the N-bit estimation DAC circuit 216. In this calibration configuration, the control and processing circuit 240 applies a zero voltage input as the analog input signal A. The feedback N-bit DAC circuit 126 converts the digital code word calibration signal 204 provided by the control and processing circuit 240 to generate analog signal 224 and the bit estimation DAC circuit 216 converts the digital output signal B to generate analog signal 222. The analog signal 223 is summed with the analog signal 224 to complete the sigma-delta loop and generate the analog feedback signal D. The digital output signal B is then processed by the control and processing circuit 240 using low pass filtering and decimation (similar to that performed by the decimator 114) in order to digitally measure the analog voltage output from the analog N-bit DAC circuit 126 in response to the applied digital code word calibration signal 204. In other words, the calibration mode is using the modulator 112 to measure only the operating characteristics of the N-bit DAC circuit 126.

The control and processing circuit 240 will apply values for the digital code word calibration signal 204 during the calibration operation which correspond to all possible digital code words generated by the N-bit quantization circuit 124 for the digital output signal B. Through processing of the digitally measured analog voltage outputs from the analog N-bit DAC circuit 126 in response to all possible digital code words, the control and processing circuit 240 can determine the error $e_i$ for each unit element (i=1, 2, . . . U) of the analog N-bit DAC circuit 126 and generate the corresponding digital code words which provide a complete picture of the non-linear response of the feedback N-bit DAC circuit 126. The generated digital code words for the unit element are programmed into the digital DAC copy circuit 118 through signal 242 in order to digitally model the operation of the feedback N-bit DAC circuit 126.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A sigma-delta modulator circuit, comprising:
a differencing circuit having a first input configured to receive an input signal and a second input configured to receive a feedback signal and an output configured to generate a difference signal;
a K-th order loop filter circuit configured to filter the difference signal and generate a change signal;
an N-bit quantization circuit configured to sample the change signal at a sampling frequency rate, quantize the sampled change signal and generate a stream of N-bit code words;
an N-bit digital-to-analog converter (DAC) circuit configured to convert the stream of N-bit code words to generate the feedback signal, wherein the N-bit DAC circuit has a non-ideal operation due to mismatch error that introduces an analog DAC error in the feedback signal; and
a digital DAC copy circuit that provides a digital replication of the N-bit DAC circuit, said digital replication accounting for the non-ideal operation of the N-bit DAC circuit due to mismatch error, the digital DAC copy circuit configured to convert the stream of N-bit code words to output a stream of P-bit code words, where P>N, that provide a digital value equivalent to an analog value of the feedback signal plus the analog DAC error that is output from the N-bit DAC circuit.

2. The circuit of claim 1, wherein noise associated with the mismatch error is high pass noise shaped, further including a low pass filter configured to filter out high frequency components of the high pass noise shaped mismatch error.

3. The circuit of claim 2, where the low pass filter is implemented by a decimation circuit configured to decimate the stream of P-bit code words at a decimation frequency rate to generate a stream of M-bit words, where M>P.

4. The circuit of claim 1, further comprising a decimation circuit configured to decimate the stream of P-bit code words at a decimation frequency rate to generate a stream of M-bit words, where M>P.

5. The circuit of claim 1, further comprising a calibration circuit configured to program the digital DAC copy circuit to provide the digital replication of the N-bit DAC circuit.

6. The circuit of claim 1, wherein the digital DAC copy circuit includes a look-up table configured to translate N-bit code word generated by the N-bit quantization circuit to a corresponding P-bit code word for output by the digital DAC copy circuit.

7. A sigma-delta modulator circuit, comprising:
a differencing circuit having a first input configured to receive an input signal and a second input configured to receive a feedback signal and an output configured to generate a difference signal;
a K-th order loop filter circuit configured to filter the difference signal and generate a change signal;
an N-bit quantization circuit configured to sample the change signal at a sampling frequency rate, quantize the sampled change signal and generate a stream of N-bit code words;
an N-bit digital-to-analog converter (DAC) circuit configured to convert the stream of N-bit code words to generate the feedback signal, wherein the N-bit DAC circuit has a non-ideal operation due to mismatch error; and
a digital DAC copy circuit that provides a digital replication of the N-bit DAC circuit, said digital replication accounting for the non-ideal operation of the N-bit DAC circuit due to mismatch error, the digital DAC copy circuit configured to convert the stream of N-bit code words to output a stream of P-bit code words, where P>N, that are functionally equivalent to the feedback signal output from the N-bit DAC circuit; and
a calibration circuit configured to program the digital DAC copy circuit to provide the digital replication of the N-bit DAC circuit, wherein the calibration circuit comprises:
an estimation N-bit DAC circuit;
a further differencing circuit configured to generate the feedback signal as a difference between a first signal output from the N-bit DAC circuit and a second signal output from the estimation N-bit DAC circuit;
a first multiplexing circuit having a first input configured to receive the stream of N-bit code words and a second input configured to receive an N-bit calibration code word,
wherein an output of the first multiplexing circuit is applied to an input of the N-bit DAC circuit;
a second multiplexing circuit having a first input configured to receive an N-bit null code word and a second input configured to receive the stream of N-bit code words, wherein an output of the second multiplexing circuit is applied to an input of the estimation N-bit DAC circuit; and
a control and processing circuit having a first input configured to receive the stream of N-bit code words and an output configured to generate a programming signal for programming the digital DAC copy circuit, wherein the control and processing circuit controls the first and second multiplexing circuits in a calibration mode to select the second inputs, apply a value for the N-bit calibration code word, and process the stream of N-bit code words in response to the applied value to determine the mismatch error of the N-bit DAC circuit for the applied value in order to program the digital DAC copy circuit to provide the digital replication.

8. The circuit of claim 7, wherein the control and processing circuit further applies a series of values for the N-bit calibration code word, and processes the stream of N-bit code words in response to the applied series of values to determine the mismatch error of the N-bit DAC circuit for the applied series of values in order to program the digital DAC copy circuit to provide the digital replication.

9. The circuit of claim 8, wherein the applied series of values include all possible values for input to the N-bit DAC circuit.

10. The circuit of claim 7, wherein the control and processing circuit further controls the first and second multiplexing circuits in a normal operating mode to select the first inputs.

11. A sigma-delta modulator circuit, comprising:
a differencing circuit having a first input configured to receive an input signal and a second input configured to receive a feedback signal and an output configured to generate a difference signal;
a K-th order loop filter circuit configured to filter the difference signal and generate a change signal;
an N-bit quantization circuit configured to sample the change signal at a sampling frequency rate, quantize the sampled change signal and generate a stream of N-bit code words;
an N-bit digital-to-analog converter (DAC) circuit configured to convert the stream of N-bit code words to generate the feedback signal, wherein the N-bit DAC circuit has a non-ideal operation due to mismatch error that introduces an analog DAC error in the feedback signal; and a digital DAC copy circuit that provides a digital replication of the N-bit DAC circuit, said digital replication accounting for the non-ideal operation of the N-bit DAC circuit due to mismatch error, the digital DAC copy circuit configured to convert the stream of N-bit code words to output a stream of P-bit code words, where P>N, each P-bit code word comprising an addition of:

a first digital code corresponding to an ideal output of the N-bit DAC circuit in response to the N-bit code word; plus a second digital code corresponding to the analog DAC error of the N-bit DAC circuit in response to the N-bit code word.

12. The circuit of claim 11, wherein noise associated with the mismatch error is high pass noise shaped, further including a low pass filter configured to filter out high frequency components of the high pass noise shaped mismatch error.

13. The circuit of claim 12, where the low pass filter is implemented by a decimation circuit configured to decimate the stream of P-bit code words at a decimation frequency rate to generate a stream of M-bit words, where M>P.

14. The circuit of claim 11, further comprising a decimation circuit configured to decimate the stream of P-bit code words at a decimation frequency rate to generate a stream of M-bit words, where M>P.

15. The circuit of claim 11, further comprising a calibration circuit configured to program the digital DAC copy circuit with the second digital code for the analog DAC error of the N-bit DAC circuit.

16. A sigma-delta modulator circuit, comprising:

a differencing circuit having a first input configured to receive an input signal and a second input configured to receive a feedback signal and an output configured to generate a difference signal;

a K-th order loop filter circuit configured to filter the difference signal and generate a change signal;

an N-bit quantization circuit configured to sample the change signal at a sampling frequency rate, quantize the sampled change signal and generate a stream of N-bit code words;

an N-bit digital-to-analog converter (DAC) circuit configured to convert the stream of N-bit code words to generate the feedback signal, wherein the N-bit DAC circuit has a non-ideal operation due to mismatch error; and a digital DAC copy circuit that provides a digital replication of the N-bit DAC circuit, said digital replication accounting for the non-ideal operation of the N-bit DAC circuit due to mismatch error, the digital DAC copy circuit configured to convert the stream of N-bit code words to output a stream of P-bit code words, where P>N, each P-bit code word comprising a combination of:

a first digital code corresponding to an ideal output of the N-bit DAC circuit in response to the N-bit code word;

a second digital code corresponding to unit element error of the N-bit DAC circuit in response to the N-bit code word;

a calibration circuit configured to program the digital DAC copy circuit to provide the digital replication of the N-bit DAC circuit, wherein the calibration circuit comprises:

an estimation N-bit DAC circuit;

a further differencing circuit configured to generate the feedback signal as a difference between a first signal output from the N-bit DAC circuit and a second signal output from the estimation N-bit DAC circuit;

a first multiplexing circuit having a first input configured to receive the stream of N-bit code words and a second input configured to receive an N-bit calibration code word, wherein an output of the first multiplexing circuit is applied to an input of the N-bit DAC circuit;

a second multiplexing circuit having a first input configured to receive an N-bit null code word and a second input configured to receive the stream of N-bit code words, wherein an output of the second multiplexing circuit is applied to an input of the estimation N-bit DAC circuit; and a control and processing circuit having a first input configured to receive the stream of N-bit code words and an output configured to generate a programming signal for programming the digital DAC copy circuit, wherein the control and processing circuit controls the first and second multiplexing circuits in a calibration mode to select the second inputs, apply a value for the N-bit calibration code word, and process the stream of N-bit code words in response to the applied value to determine unit element error of the N-bit DAC circuit for the applied value.

17. The circuit of claim 16, wherein the control and processing circuit further controls the first and second multiplexing circuits in a normal operating mode to select the first inputs.

18. The circuit of claim 16, wherein the control and processing circuit further applies a series of values for the N-bit calibration code word, and processes the stream of N-bit code words in response to the applied series of values to determine the unit element error.

19. The circuit of claim 18, wherein the applied series of values include all possible values for input to the N-bit DAC circuit.

20. A sigma-delta modulator circuit, comprising:

a differencing circuit having a first input configured to receive an input signal and a second input configured to receive a feedback signal and an output configured to generate a difference signal;

a K-th order loop filter circuit configured to filter the difference signal and generate a change signal;

an N-bit quantization circuit configured to sample the change signal at a sampling frequency rate, quantize the sampled change signal and generate a stream of N-bit code words;

an N-bit digital-to-analog converter (DAC) circuit configured to convert the stream of N-bit code words to generate the feedback signal, wherein the N-bit DAC circuit has a non-ideal operation due to mismatch error; and a digital DAC copy circuit that provides a digital replication of the N-bit DAC circuit, said digital replication accounting for the non-ideal operation of the N-bit DAC circuit due to mismatch error, the digital DAC copy circuit configured to convert the stream of N-bit code words to output a stream of P-bit code words, where P>N, that are functionally equivalent to the feedback signal output from the N-bit DAC circuit;

a calibration circuit configured to program the digital DAC copy circuit to provide the digital replication of the N-bit DAC circuit, wherein the calibration circuit comprises:
  a multiplexing circuit having a first input configured to receive the stream of N-bit code words and a second input configured to receive an N-bit calibration code word, wherein an output of the first multiplexing circuit is applied to an input of the N-bit DAC circuit; and
  a control and processing circuit having a first input configured to receive the stream of N-bit code words and an output configured to generate a programming signal for programming the digital DAC copy circuit, wherein the control and processing circuit controls the multiplexing circuit in a calibration mode to select the second input, apply a value for the N-bit calibration code word, and process the stream of N-bit code words in response to the applied value to determine the mismatch error of the N-bit DAC circuit for the applied value in order to program the digital DAC copy circuit to provide the digital replication.

21. The circuit of claim 20, wherein noise associated with the mismatch error is high pass noise shaped, further including a low pass filter configured to filter out high frequency components of the high pass noise shaped mismatch error.

22. The circuit of claim 21, where the low pass filter is implemented by a decimation circuit configured to decimate the stream of P-bit code words at a decimation frequency rate to generate a stream of M-bit words, where M>P.

23. The circuit of claim 20, further comprising a decimation circuit configured to decimate the stream of P-bit code words at a decimation frequency rate to generate a stream of M-bit words, where M>P.

24. The circuit of claim 20, further comprising a calibration circuit configured to program the digital DAC copy circuit to provide the digital replication of the N-bit DAC circuit.

25. The circuit of claim 20, wherein the control and processing circuit further controls the multiplexing circuit in a normal operating mode to select the first input.

26. The circuit of claim 20, wherein the control and processing circuit further applies a series of values for the N-bit calibration code word, and processes the stream of N-bit code words in response to the applied series of values to determine the mismatch error of the N-bit DAC circuit for the applied series of values in order to program the digital DAC copy circuit to provide the digital replication.

27. The circuit of claim 26, wherein the applied series of values include all possible values for input to the N-bit DAC circuit.

28. The circuit of claim 20, wherein the digital DAC copy circuit includes a look-up table configured to translate N-bit code word generated by the N-bit quantization circuit to a corresponding P-bit code word for output by the digital DAC copy circuit.

* * * * *